United States Patent
Sha et al.

(10) Patent No.: US 11,471,997 B2
(45) Date of Patent: Oct. 18, 2022

(54) POLISHING PAD, POLISHING APPARATUS AND A METHOD FOR POLISHING SILICON WAFER

(71) Applicant: Zing Semiconductor Corporation, Shanghai (CN)

(72) Inventors: Youhe Sha, Shanghai (CN); Yue Xie, Shanghai (CN)

(73) Assignee: Zing Semiconductor Corporation, Shanghai (CN)

(*) Notice: Subject to any disclaimer, the term of this patent is extended or adjusted under 35 U.S.C. 154(b) by 0 days.

(21) Appl. No.: 17/136,544

(22) Filed: Dec. 29, 2020

(65) Prior Publication Data

US 2022/0009051 A1    Jan. 13, 2022

(30) Foreign Application Priority Data

Jul. 8, 2020  (CN) .......................... 202010659738.4

(51) Int. Cl.
  *B24B 37/04* (2012.01)
  *H01L 21/306* (2006.01)
  *B24B 37/26* (2012.01)

(52) U.S. Cl.
  CPC ............ *B24B 37/042* (2013.01); *B24B 37/26* (2013.01); *H01L 21/30625* (2013.01)

(58) Field of Classification Search
  CPC ....... B24B 37/042; B24B 37/26; B24B 37/20; B24B 37/22; B24B 37/12; B24B 37/16
  See application file for complete search history.

(56) References Cited

U.S. PATENT DOCUMENTS

| 4,037,367 | A | * | 7/1977 | Kruse | ................ | B24D 7/10 451/551 |
| 5,243,790 | A | * | 9/1993 | Gagne | ................ | B24D 7/10 451/529 |
| 5,394,655 | A | | 3/1995 | Allen et al. | | |
| 5,558,563 | A | | 9/1996 | Cote et al. | | |

(Continued)

FOREIGN PATENT DOCUMENTS

| JP | H07-211676 A | 8/1995 |
| JP | H11-058218 A | 3/1999 |
| JP | 2005-277089 A | 10/2005 |

OTHER PUBLICATIONS

Taiwanese Office Action, dated Oct. 12, 2021, in a counterpart Taiwanese patent application, No. TW 109137049.

(Continued)

*Primary Examiner* — Joel D Crandall
(74) *Attorney, Agent, or Firm* — Chen Yoshimura LLP (57) ABSTRACT

The present invention provides a polishing pad, a polishing apparatus and a polishing method for a silicon wafer. The polishing pad comprises a polishing surface in contact with the silicon wafer. The polishing surface is provided with at least one groove. When polishing the silicon wafer, the edge of the silicon wafer is at least partially suspended above the groove. The polishing pad, polishing apparatus and silicon wafer polishing method according to the present invention can reduce the polishing rate at the edge of the silicon wafer while keeping the polishing rate of the entire wafer basically unchanged, thereby improving the flatness of the edge thickness of the silicon wafer as well as improving the production yield.

4 Claims, 9 Drawing Sheets

(56) References Cited

U.S. PATENT DOCUMENTS

| | | | | |
|---|---|---|---|---|
| 6,120,366 A * | 9/2000 | Lin | .................. | B24B 37/26 |
| | | | | 451/550 |
| 6,135,868 A * | 10/2000 | Brown | ................ | B24B 37/26 |
| | | | | 451/443 |
| 6,159,073 A * | 12/2000 | Wiswesser | ........... | B24B 37/04 |
| | | | | 451/6 |
| 6,685,548 B2 * | 2/2004 | Chen | ................... | B24B 37/26 |
| | | | | 451/526 |
| 6,974,372 B1 * | 12/2005 | Muldowney | ........ | B24B 37/26 |
| | | | | 451/527 |
| 8,287,793 B2 * | 10/2012 | Deopura | .......... | B24D 18/0009 |
| | | | | 264/316 |
| 8,734,206 B2 * | 5/2014 | Chang | ................. | B24B 41/06 |
| | | | | 451/286 |
| 2009/0209185 A1 * | 8/2009 | Motonari | .............. | B24B 37/26 |
| | | | | 451/527 |

OTHER PUBLICATIONS

Japanese Office Action, dated Apr. 26, 2022 in a counterpart Japanese patent application, No. JP 2021-001784.

* cited by examiner

POLISHING PAD, POLISHING APPARATUS AND A METHOD FOR POLISHING SILICON WAFER

BACKGROUND OF THE INVENTION

1. Field of the Invention

The present invention relates to a semiconductor manufacture, in particular to a polishing pad, a polishing apparatus and a method for polishing silicon wafer.

2. Description of the Related Art

With continued technical developments of integrated circuit (IC), the quality and property of silicon wafer are highly requested. In particular, the flatness of silicon wafer is more strictly requested to prevent from exposure defocus.

Generally, the silicon wafer is subjected to double side polish (DSP) and final polish (FP). DSP is used to polish the front side and back side of the wafer, and control the shape of the wafer by polishing disc. FP is used to polish the front side of the wafer.

For the final polishing process, it is difficult to control the thickness of the wafer at extreme edge. During the polishing process, the polishing liquid easily accumulates at the edge, causing the thinner edge of the wafer. The conventional apparatus and the conventional process are unable to precisely regulate the polishing at the edge position of 145 mm~149 mm of the silicon wafer, especially when the polishing rate for entire wafer has to be maintained. Reduction of polishing rate at the wafer edge cannot be achieved by adjusting the conventional process parameters.

SUMMARY

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

To solve the problems in the conventional technology, the present application provides a polishing pad for polishing a silicon wafer. The polishing pad has a polishing surface contacting to the silicon wafer. The polishing surface is provided with at least one groove. During the polishing, at least partial edge of the silicon wafer suspends above the groove.

In one embodiment, the groove comprises a first annular groove near the pad edge and a second annular groove near the pad center.

In one embodiment, the silicon wafer has a diameter larger than a distance between the inner edge of the first annular groove and the outer edge of the second annular groove, and less than or equal to a distance between the outer edge of the first annular groove and the inner edge of the second annular groove.

In one embodiment, the polishing pad, the first annular groove and the second annular groove are concentric.

In one embodiment, the first annular groove has a width of 3 mm~8 mm, a depth of 0.5 mm~2 mm, an outer edge radius of 335 mm~340 mm, and an inner edge radius of 330 mm~335 mm.

In one embodiment, the second annular groove has a width of 3 mm~~8 mm, a depth of 0.5 mm~2 mm, an outer edge radius of 35 mm~45 mm, and an inner edge radius of 30 mm~40 mm.

The present application also provides a polishing apparatus for polishing a silicon wafer comprising: a polishing pad as described above; a driving device for driving the polishing pad disposed thereon to rotate; a polishing head for fixing the silicon wafer to contact the front side of the silicon wafer with the polishing pad and suspend the edge of the silicon wafer above the groove of the polishing pad.

The present application further provides a process for polishing a silicon wafer, comprising: fixing a silicon wafer by a polishing head; contacting the front side of the silicon wafer to a polishing surface of a polishing pad driven by the polishing head, wherein an edge of the silicon wafer suspends above a groove of the polishing surface of the polishing pad; driving the polishing head and the polishing pad to rotate to polish the front side of the silicon wafer.

In one embodiment, the polishing head and the polishing pad rotate with same direction.

In one embodiment, the process further comprises: adjusting the contact area of the edge of the silicon wafer to the groove by controlling the motion of polishing head, and thereby adjusting the polishing rate to the edge of the silicon wafer.

In one embodiment, the step of controlling the motion of polishing head comprises: controlling the polishing head to conduct reciprocating motion along with a radius direction of the polishing pad.

According to the present invention, the polishing pad, the polishing apparatus and the polishing method for silicon wafer can reduce the polishing rate at the edge of the silicon wafer while keeping the polishing rate of the entire wafer basically unchanged, thereby improving the flatness of the edge thickness of the silicon wafer as well as improving the production yield.

In other embodiments, the present application also provides a process.

DETAILED DESCRIPTION OF THE EMBODIMENTS

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

In one embodiment, to solve the problems regarding the difficult control of edge thickness of the silicon wafer, the present application provides a polishing pad for polishing a silicon wafer. The polishing pad has a polishing surface contacting to the silicon wafer. The polishing surface is provided with at least one groove. During the polishing, at least partial edge of the silicon wafer suspends above the groove.

In another embodiment, the present application provides a polishing apparatus for polishing a silicon wafer comprising: a polishing pad as described in the above embodiments; a driving device for driving the polishing pad disposed thereon to rotate; a polishing head for fixing the silicon wafer to contact the front side of the silicon wafer with the polishing pad and suspend the edge of the silicon wafer above the groove of the polishing pad.

In another embodiment, the present application further provides a process for polishing a silicon wafer, comprising: fixing a silicon wafer by a polishing head; contacting the front side of the silicon wafer to a polishing surface of a polishing pad driven by the polishing head, wherein an edge of the silicon wafer suspends above a groove of the polishing surface of the polishing pad; driving the polishing head and the polishing pad to rotate to polish the front side of the silicon wafer According to the present invention, since a groove is disposed to reduce the contact area as well as the contact time between the polishing pad and the edge of the silicon wafer, the mechanical action to the edge of the silicon wafer can be reduced. Therefore, the polishing pad, the polishing apparatus and the polishing method for silicon wafer of the present application can reduce the polishing rate at the edge of the silicon wafer while keeping the polishing rate of the entire wafer basically unchanged, thereby improving the flatness of the edge thickness of the silicon wafer as well as improving the production yield.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments.

Example embodiments of the polishing pad will now be described more fully with reference to the accompanying drawings FIGS. 1-5.

EXAMPLES

Example 1

Figure 1:
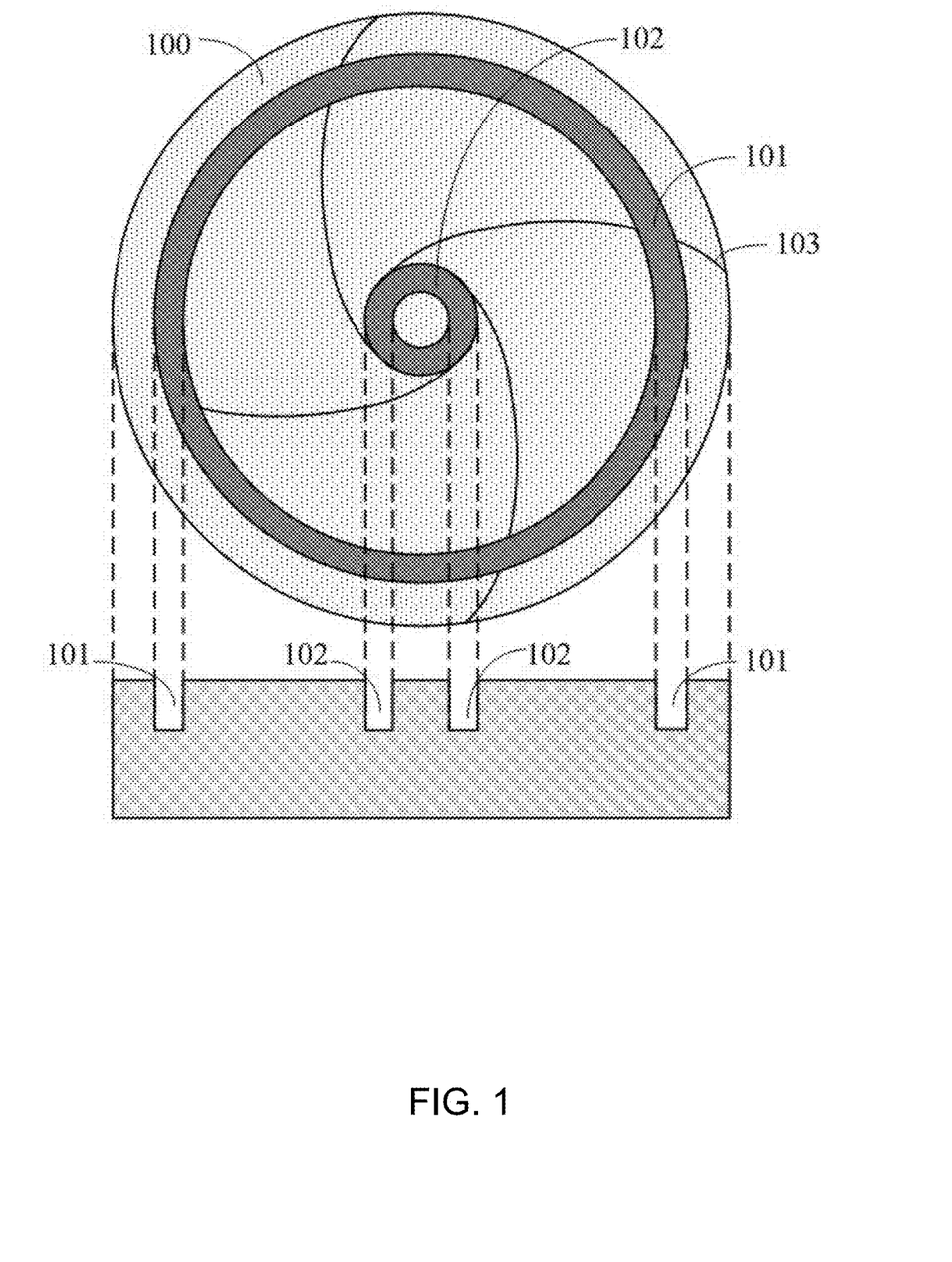
FIG. 1 shows a schematic view of a structure of a polishing pad in accordance with one embodiment of the present application.

In one embodiment, as shown in FIG. 1, the polishing pad 100 can be a circular polishing pad, the polishing surface is provided with grooves. The grooves can include the first annular groove 101 near the pad edge and a second annular groove 102 near the pad center. The polishing surface between the first annular groove 101 and the second annular groove 102 can be plane. For example, the first annular groove 101 and the second annular groove 102 are concentric. The sectional shape of the first annular groove 101 and the second annular groove 102 can include, but not be limited to, rectangle.

In some embodiments, the distance between the inner edge of the first annular groove 101 and the outer edge of the second annular groove 102 is smaller than the diameter of the silicon wafer. The distance between the outer edge of the first annular groove 101 and the inner edge of the second annular groove 102 is larger than or equal to the diameter of the silicon wafer. While the polishing pad 100 is used to polish the silicon wafer, referring FIG. 2 and FIG. 3, the silicon wafer 200 is disposed between the first annular groove 101 and the second annular groove 102, and the two opposite edges of the silicon wafer 200 simultaneously and respectively suspend above the first annular groove 101 and the second annular groove 102. In embodiments, the width of the edge of the silicon wafer 200 suspended above the first annular groove 101 is basically same to that above the second annular groove 102. The silicon wafer can be processed by DSP. In embodiments, the silicon wafer is semiconductor silicon wafer, which can include, but not be limited to, monocrystalline silicon wafer, sapphire silicon wafer, silicon carbide wafer and the like.

Regarding 12-inch silicon wafer, some exemplified parameters the polishing pad 100 which improves polishing effects at the position 145-149 mm of the wafer edge are provided as follows. Referring FIG. 4, in one embodiment, the first annular groove 101 has a width D1 of 3 mm~8 mm, such as 5 mm, a depth H1 of 0.5 mm~2 mm. Its outer edge, i.e. the outer circle close to the pad edge, has a radius of 335 mm~340 mm, such as 339 mm Its inner edge, i.e. the inner circle close to the pad center, has a radius of 330 mm~335 mm, such as 334 mm.

Figure 4:
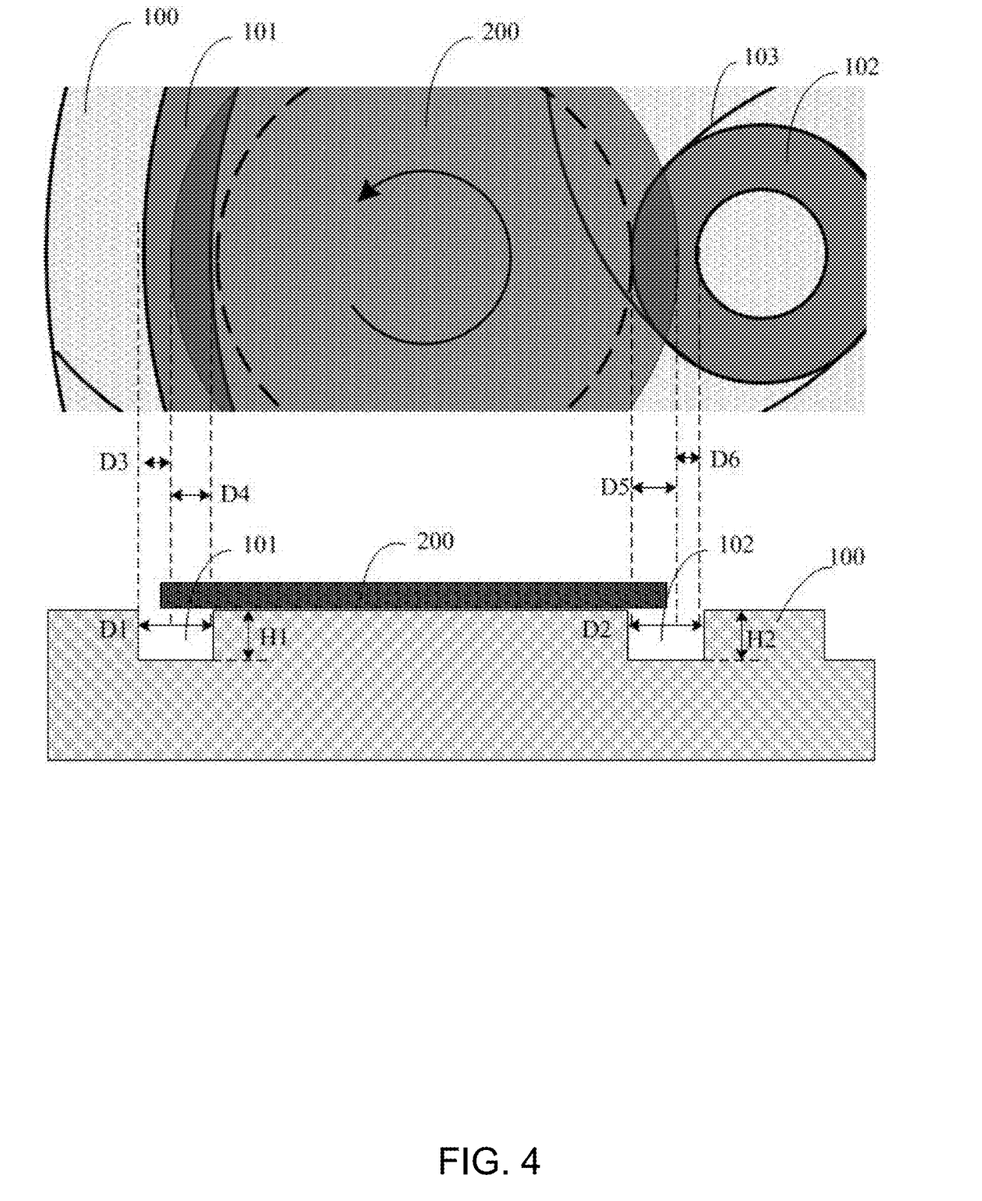
FIG. 4 shows a schematic view of groove size of a polishing pad in accordance with one embodiment of the present application.

The width and depth of the second annular groove 102 can be identical or similar to that of the first annular groove 101, i.e. the second annular groove 102 has a width D2 of 3 mm~8 mm, such as 5 mm, a depth H2 of 0.5 mm~2 mm. Its outer edge, i.e. the outer circle close to the pad edge, has a radius of 35 mm~45 mm, such as 40 mm Its inner edge, i.e. the inner circle close to the pad center, has a radius of 30 mm~40 mm, such as 35 mm.

Further, referring FIG. 4, the distance between the outer edge of the first annular groove 101 and the inner edge of the second annular groove 102 is larger than or equal to the diameter of the silicon wafer. While the silicon wafer is disposed between the first annular groove 101 and the second annular groove 102, both of the first annular groove 101 and the second annular groove 102 are located below the silicon wafer 200 and some parts of the grooves are beyond the silicon wafer 200. Accordingly, in the polishing process, the contact area between the silicon wafer 200 and the grooves can be adjusted by moving the silicon wafer 200 toward right or left along with the radius direction of the polishing pad 100, thereby the polishing rate to the silicon wafer 200 can be adjusted.

For example, the distance D3 between the outer edge of the first annular groove 101 and the edge of the silicon wafer 200 and the distance D6 between the inner edge of the second annular groove 102 and the edge of the silicon wafer 200 can be 1 mm~2 mm. The distance D4 between the inner edge of the first annular groove 101 and the edge of the silicon wafer 200 and the distance D5 between the outer edge of the second annular groove 102 and the edge of the silicon wafer 200 can be 2 mm~3 mm Namely, the width of the silicon wafer 200 contacting with the groove is 2 mm~3 mm and the amplitude of the left and right movement can be 2 mm~4 mm.

Noted that some parameters of the polishing pad 100 are provided herein, but the parameters of the pad are not limited accordingly. A person having ordinary skills in the art is able to adjust them based on the size of the silicon wafer or other requirements.

Figure 5:
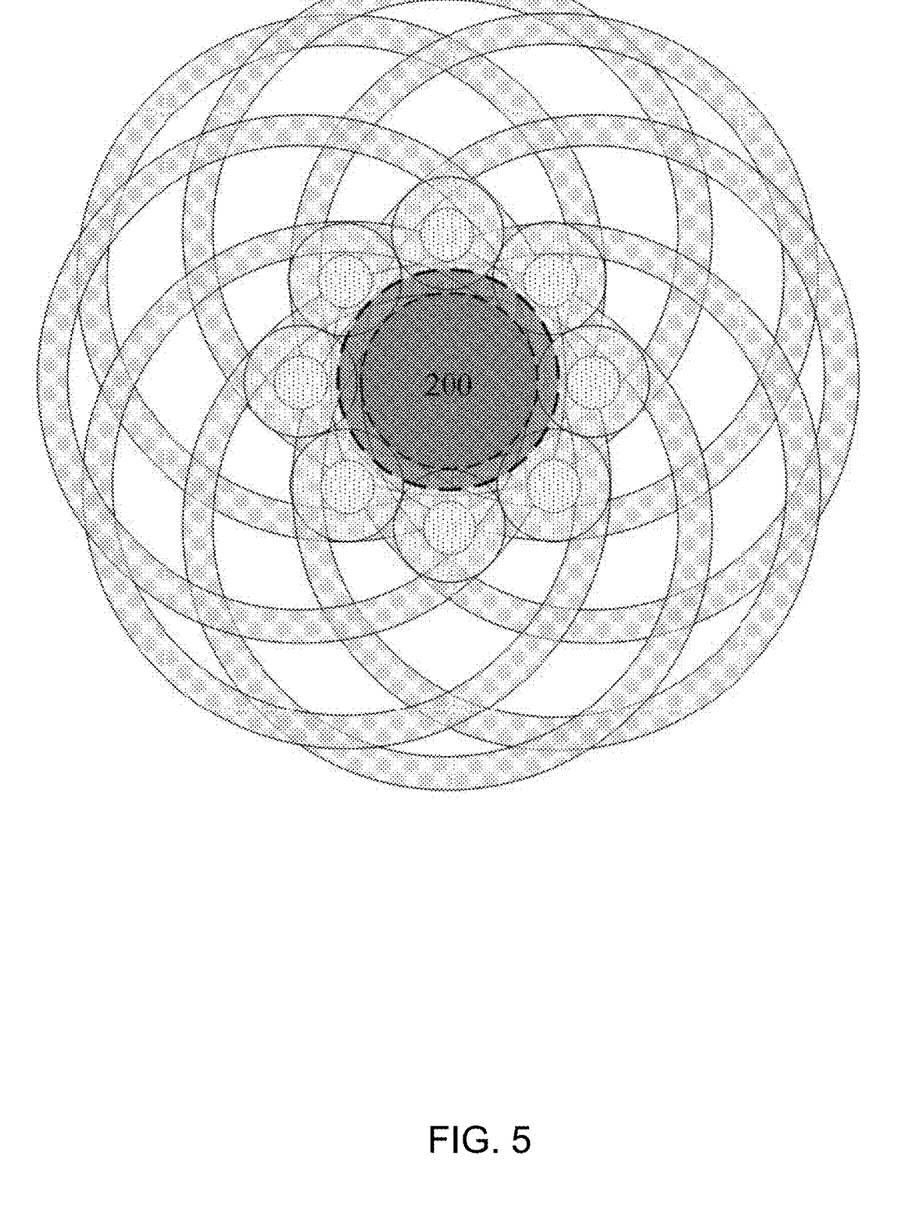
FIG. 5 shows a schematic view of a motion track of a groove relative to a silicon wafer edge during the polishing process in accordance with one embodiment of the present application.

FIG. 5 shows a schematic view of a motion track of the groove of the pad relative to the edge of the silicon wafer 200 during the polishing process in accordance with one embodiment of the present application. As shown in FIG. 5, when the polishing pad 100 is rotating, the polishing head drives the silicon wafer 200 to rotate in same direction. If the silicon wafer 200 is determined as static state, it observes that the polishing pad 100 rotates around the center of the silicon wafer 200. Namely, the first annular groove 101 and the second annular groove 102 on the polishing pad 100 rotate around the center of the silicon wafer 200, therefore, the motion track as shown in FIG. 5 is formed. In FIG. 5, the area defined by the two dotted lines of the silicon wafer 200 is the edge area passing through the grooves, and its width can be D4 or D5 shown in FIG. 4. Comparing with the remaining area except the edge of the silicon wafer, the existence of the first annular groove and the second annular groove reduces the contact area and the contact time between the edge of the silicon wafer and the polishing pad.

Further, as shown in FIG. 5, the polishing head drives the silicon wafer 200 to rotate. Even if the polishing pad 100 merely has the first annular groove 101 or the second annular groove 102, the groove is able to pass through every position at the edge of the silicon wafer 200. In some embodiments, polishing pad 100 can be provided with only the first annular groove 101 or only the second annular groove 102.

In one embodiment, the polishing pad 100 is further provided with one or plural drainage groove 103. The drainage groove 103 connects the groove and the edge of the polishing pad 100 to remove the polishing liquid from the groove. As shown in FIG. 1, the drainage groove 103 connects the second annular groove 102 by one terminal, passes through the first annular groove 101, and connects to the edge of the polishing pad 100 by another terminal. The drainage groove 103 is able to drain the polishing liquid from the first annular groove 101 and the second annular groove 102 during the rotation of the polishing pad 100. It prevent from the surface damages of the silicon wafer caused by sedimentation of the polishing liquid and debris.

Figure 2:
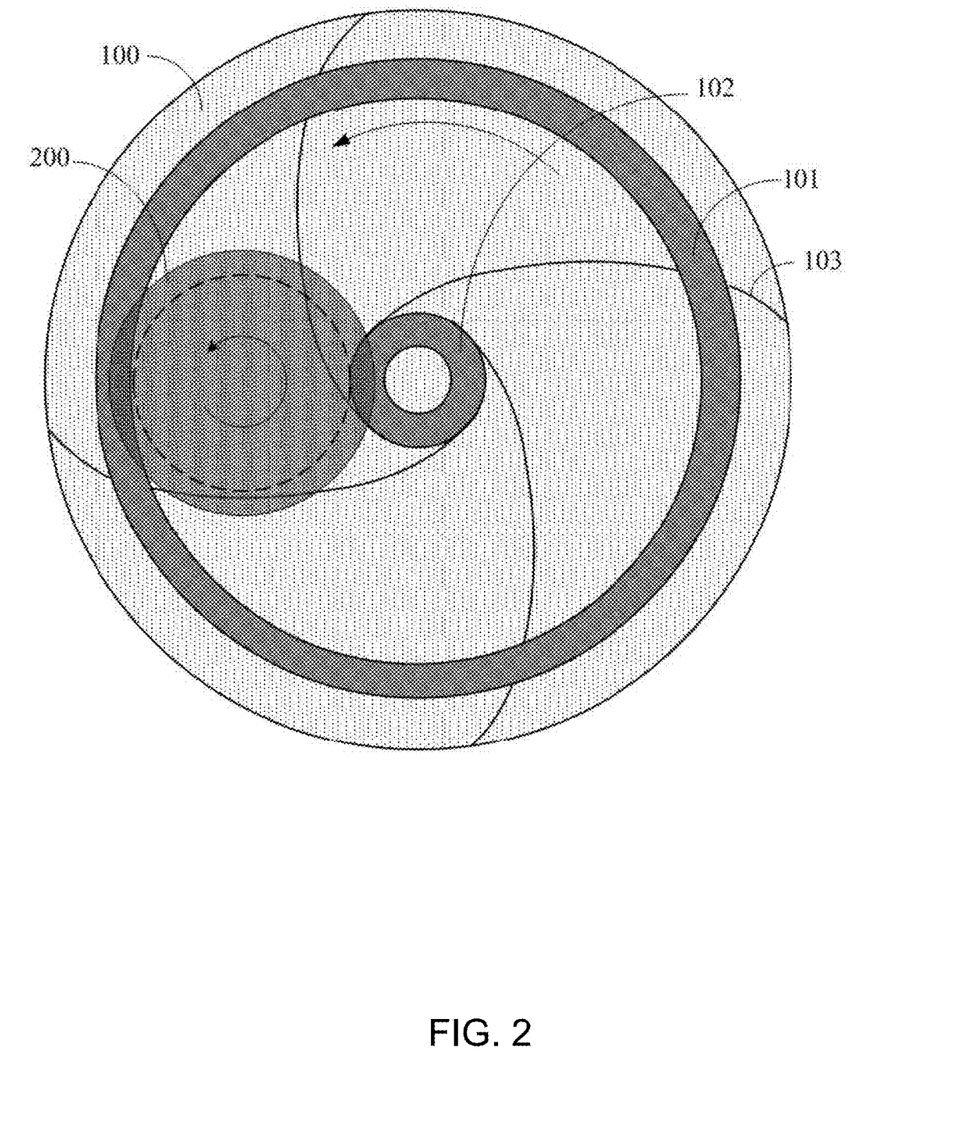
FIG. 2 shows a schematic view of a silicon wafer polished by a polishing pad in accordance with one embodiment of the present application.
Figure 3:
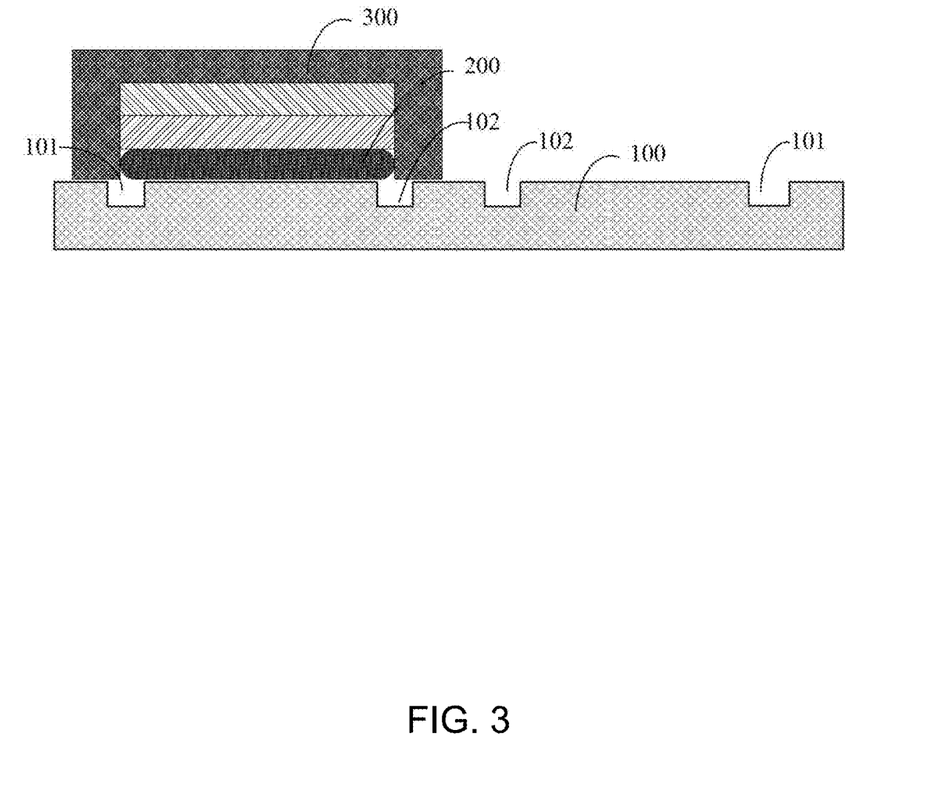
FIG. 3 shows a sectional view of a polishing pad and a silicon wafer in accordance with one embodiment of the present application.

In one embodiment, referring FIG. 2, the drainage groove 103 is arch. The arch protrudes toward the rotation direction of the polishing pad, so that it is facilitate to drain the polishing liquid from the grooves by the centrifugal force from the rotation of the polishing pad 100. For example, the drainage groove 103 can be tangent with the outer edge of the second annular groove 102.

For example, the drainage groove 103 has a depth not less than the depth of the first annular groove 101 or the second annular groove 102, so that the polishing liquid flows easily from the first annular groove 101 and the second annular groove 102 to the drainage groove 103. The drainage groove 103 can be symmetrically disposed around the circle of the polishing pad 100. In one embodiment, the depth of the drainage groove 103 can be uniformly distributed. In one embodiment, the depth of the drainage groove 103 can gradually increase from the center to the edge of the polishing pad 100. As shown in FIG. 1 and FIG. 2, the drainage groove 103 can start from the second annular groove 102, passing through the first annular groove 101, and extend to the edge of polishing pad 100. Or, the drainage groove connecting the second annular groove 102 and the first annular groove 101 can be disposed independently from the drainage groove connecting the first annular groove 101 and the edge of the polishing pad 100, and the numbers of the two kinds of the drainage groove can be same or different, so long as the polishing liquid can be removed from the first annular groove 101 and the second annular groove 102.

Though the four drainage grooves 103 are illustrated in FIG. 1 and FIG. 2, the number is not limited therein. A person having ordinary skills in the art is able to adjust and modify the drainage groove's number, width, depth, radian and the like according to flow rate of polishing liquid, rotation rate of polishing pad, size of the first annular groove 101 and the second annular groove 102 to effectively drain the polishing liquid from the first annular groove 101 and the second annular groove 102.

Therefore, the polishing pad of the present application can reduce the polishing rate at the edge of the silicon wafer while keeping the polishing rate of the entire wafer basically unchanged, thereby improving the flatness of the edge thickness of the silicon wafer as well as improving the production yield.

Example 2

Figure 6:
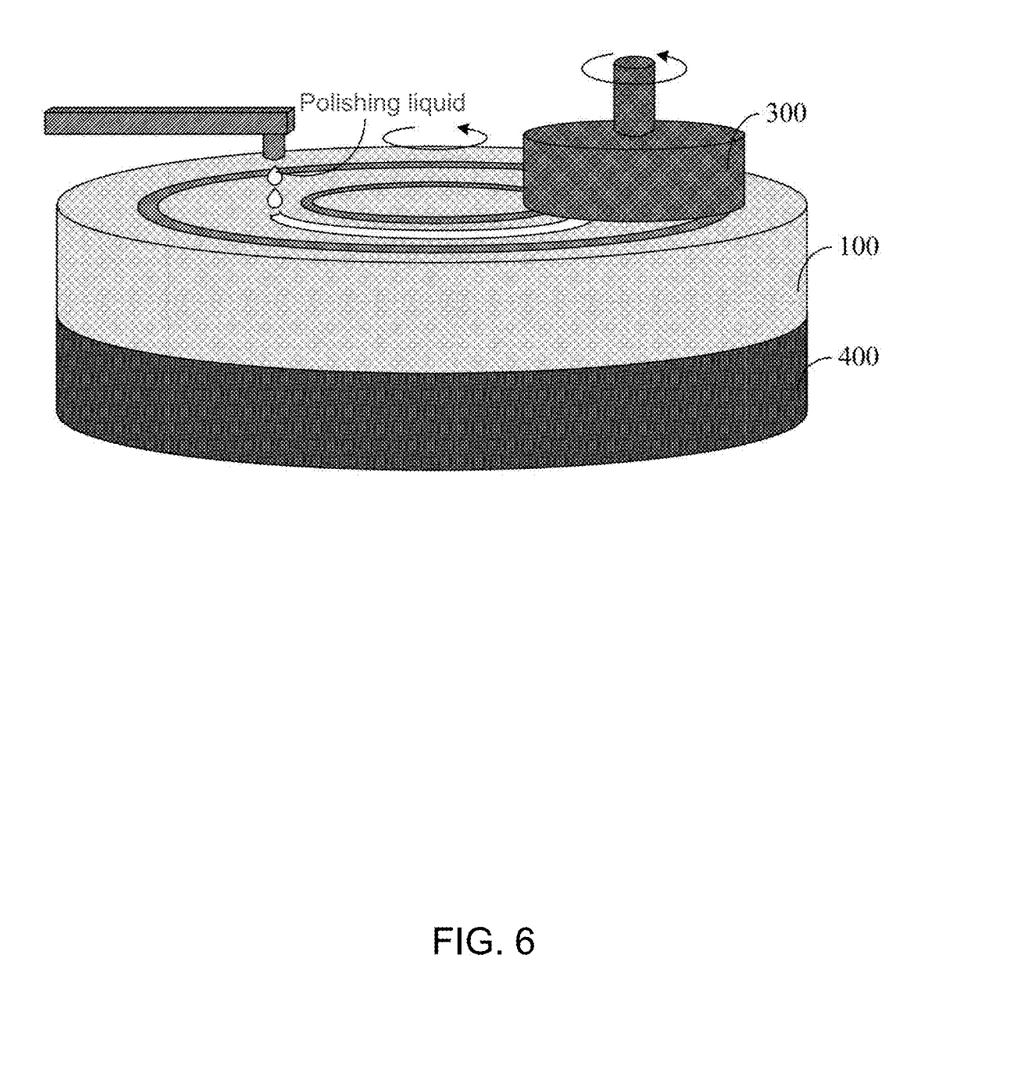
FIG. 6 shows a schematic view of a structure of a polishing apparatus in accordance with one embodiment of the present application.

Referring FIG. 6, an polishing apparatus is provided in this embodiment. The polishing apparatus comprises a polishing pad 100, a driving device 400 and a polishing head 300. The polishing pad 100 can be any polishing pad as described above, i.e. the polishing pad 100 having a polishing surface with at least one groove, and at least partial edge of the silicon wafer hangs above the groove during polishing. The polishing pad 100 is disposed on the driving device 400, and is driven by the driving device 400 to rotate. The polishing head 300 is used to fix the silicon wafer to contact the front side of the silicon wafer with the polishing pad 100 and suspend the edge of the silicon wafer above the groove of the polishing pad 100.

The driving device 400 can be a big turntable disposed below the polishing pad 100, and drives the polishing pad 100 to rotate clockwise or counterclockwise.

The polishing head 300 is disposed above the polishing pad 100 for carrying the silicon wafer. In one embodiment, the polishing head 300 comprises a base, a backing and a fixing part. To load the silicon wafer, a chamber between the base and the backing is evacuated to suck the silicon wafer. During the polishing process, the polishing head 300 applies a force to the back side of the silicon wafer and drives the silicon wafer to rotate with a certain speed. The rotation direction of the silicon wafer can be same to that of the polishing pad 100.

In one embodiment, a supply port can be disposed above the polishing pad to supply the polishing liquid to the polishing pad.

In the polishing apparatus, the polishing pad having a groove correspondent to the edge of the silicon wafer is provided. In embodiments, the above polishing pad can be applied with the conventional polishing apparatus. Accordingly, the polishing apparatus according to the present invention can reduce the polishing rate at the edge of the silicon wafer while keeping the polishing rate of the entire wafer basically unchanged, thereby improving the flatness of the edge thickness of the silicon wafer as well as improving the production yield.

Example 3

Figure 7:
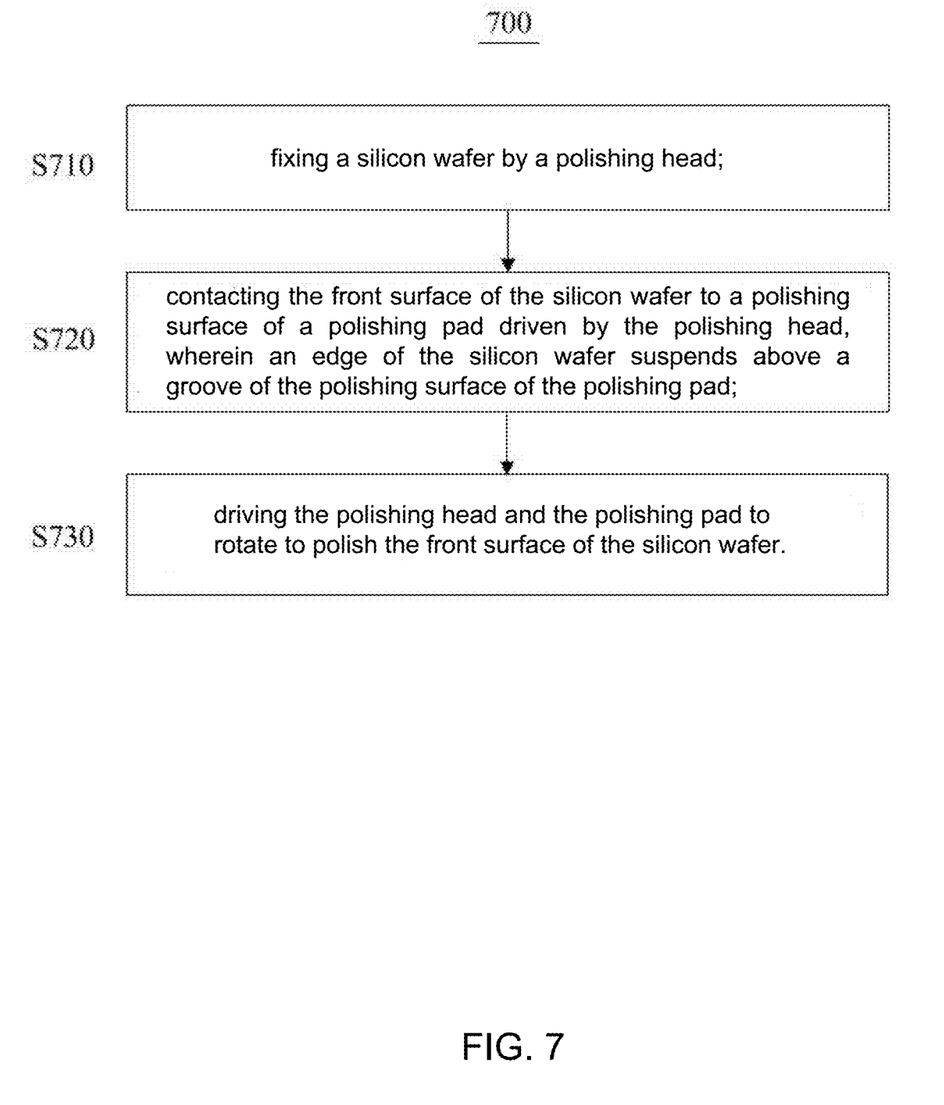
FIG. 7 shows a flow chart of a method for polishing silicon wafer in accordance with one embodiment of the present application.

Referring FIG. 7, the polishing method comprises the following steps.

Step S710: fixing a silicon wafer by a polishing head.

The silicon wafer can be processed by DSP. The polishing head can suck the silicon wafer via evacuation.

Step S720: contacting the front surface of the silicon wafer to a polishing surface of a polishing pad driven by the polishing head, wherein an edge of the silicon wafer hangs above a groove of the polishing surface of the polishing pad.

In one embodiment, the polishing surface of the polishing pad is provided with a first annular groove near the pad edge and/or a second annular groove near the pad center. The polishing head can drive the silicon wafer and fix the silicon wafer between the first annular groove and the second annular groove. At this time, the two opposite edges at the same diameter of the silicon wafer respectively suspend above the first annular groove and the second annular groove. Namely, a certain area of the edge of the silicon wafer suspends above the first annular groove and the second annular groove, and does not contact with the polishing pad. For example, a distance between the outer edge of the first annular groove and the inner edge of the second annular groove is larger than the diameter of the silicon wafer, thereby a certain space is maintained for the left and right motion of the silicon wafer.

The structure of the polishing pad and the location relationship between the silicon wafer and the polishing pad can be referred the above descriptions.

Step S730: driving the polishing head and the polishing pad to rotate to polish the front side of the silicon wafer.

Specifically, during the polishing process, the polishing head applies a force to the back side of the silicon wafer and drives the silicon wafer to rotate with a certain speed. The rotation direction of the silicon wafer can be same to that of the polishing pad, i.e. both are clockwise or both are counterclockwise. During the rotation of the polishing pad and the silicon wafer, the edge of the silicon wafer continuously passes through the first annular groove and the second annular groove, causing reduction of contact time and area between the polishing pad and the edge of the silicon wafer. Accordingly, the polishing rate at the edge of the silicon wafer can be reduced while keeping the polishing rate of the entire wafer basically unchanged, thereby improving the flatness of the edge thickness of the silicon wafer as well as improving the production yield.

Figure 8:
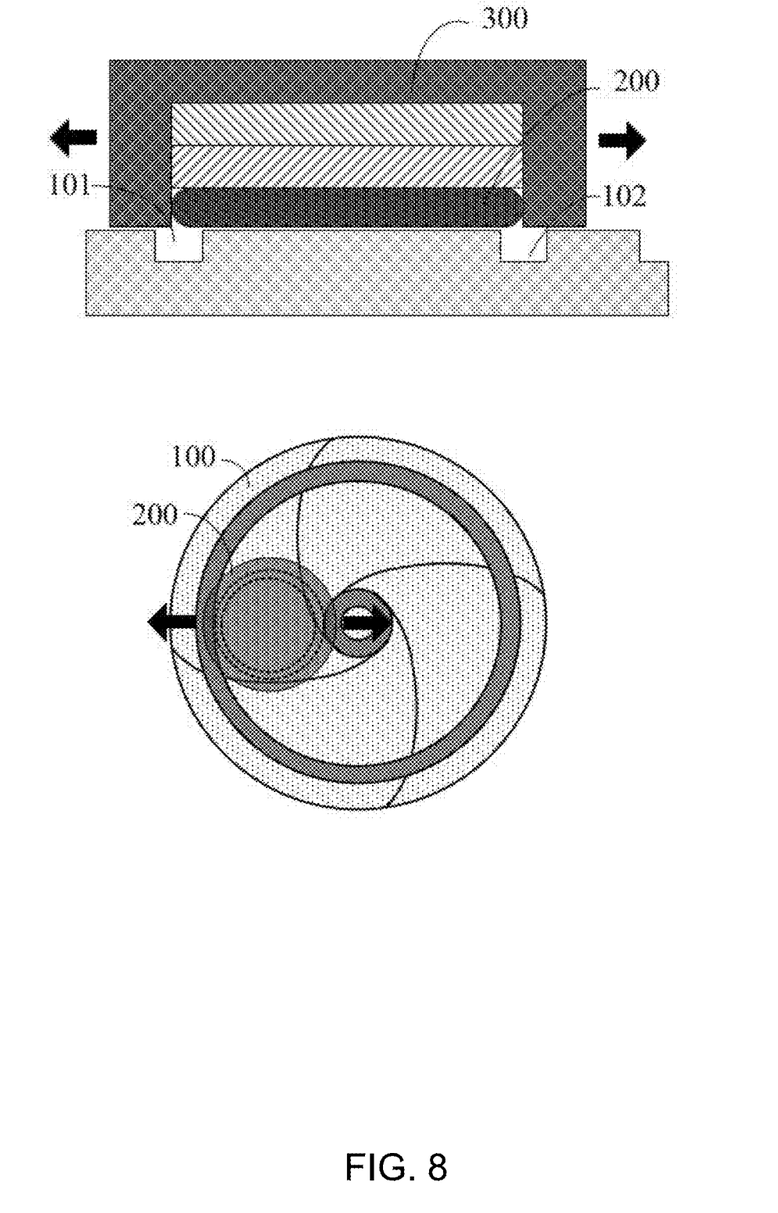
FIG. 8 shows a schematic view of motion of a polishing head during the polishing process in accordance with one embodiment of the present application.

In some embodiments, in addition to rotation and applying force, the polishing head is able to adjust the area of the silicon wafer suspending above the grooves by its motion. The polishing rate at the edge of the silicon wafer can be adjusted thereby. In one embodiment, referring FIG. 8, the motion of the polishing head is reciprocating motion. It can be understood that, the width of the edge of the silicon wafer suspending above the groove is larger while the amplitude of the left and right movement is larger.

Figure 9:
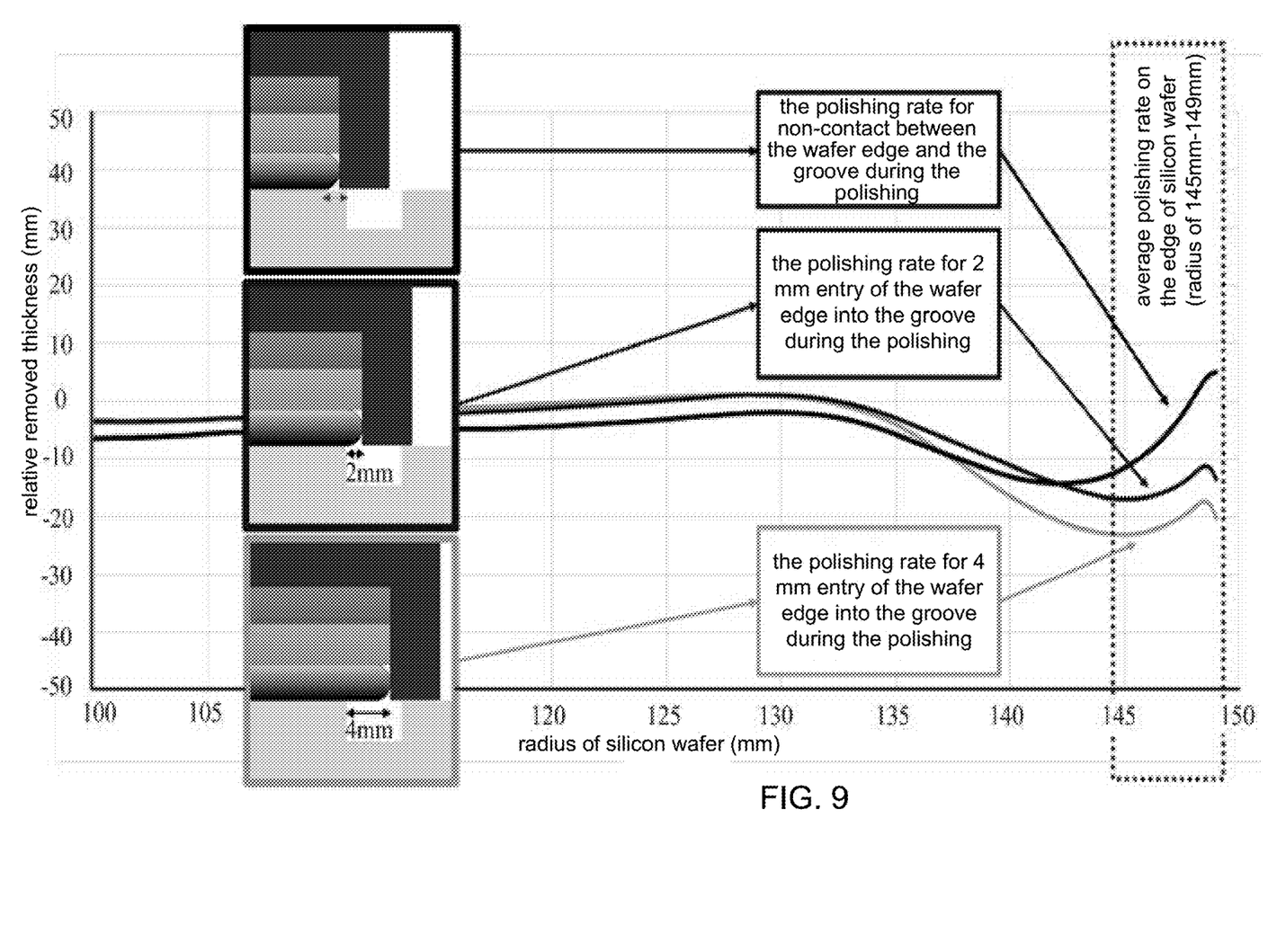
FIG. 9 shows a relationship between a removed thickness and a wafer radius with various entry sizes of wafer edge into the groove.

FIG. 9 shows a relationship between a removed thickness and a silicon wafer radius with the sizes of 0, 2 mm and 4 mm of the wafer edge suspending above groove. It can be observed from FIG. 9 that, while the contact width of the wafer edge is larger, the relative removed thickness at the wafer edge (the position at the radius 145 mm~149 mm) is smaller, i.e. the polishing rate at the edge of the silicon wafer is slower.

According to the polishing method of the present application, the polishing rate at the edge of the silicon wafer can be reduced while keeping the polishing rate of the entire wafer basically unchanged, thereby improving the flatness of the edge thickness of the silicon wafer as well as improving the production yield.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A polishing pad for polishing a silicon wafer comprising a polishing surface for contacting the silicon wafer,
    wherein the polishing pad has a first annular groove near a pad edge and a second annular groove near a pad center, and at least one drainage groove;
    wherein at least a partial edge of the silicon wafer suspends above at least one of the first annular groove, the second annular groove and the drainage groove during polishing;
    wherein the first annular groove has a width of 3 mm~8 mm, a depth of 0.5 mm~2 mm, an outer edge radius of 335 mm~340 mm, and an inner edge radius of 330 mm~335 mm; and the second annular groove has a width of 3 mm~8 mm, a depth of 0.5 mm~2 mm, an outer edge radius of 35 mm~45 mm, and an inner edge radius of 30 mm~40 mm; and wherein the drainage groove is arch and tangent with the outer edge of the second annular groove, and the drainage groove connects the second annular groove at one terminal, passes through the first annular groove, and connects to the edge of the polishing pad at another terminal.

2. The polishing pad of claim 1, wherein a first distance is between the inner edge of the first annular groove and the outer edge of the second annular groove, and the first distance is less than a diameter of the silicon wafer; and second distance is between the outer edge of the first annular groove and the inner edge of the second annular groove, and the second distance is larger than the diameter of the silicon wafer.

3. The polishing pad of claim 1, wherein the polishing pad, the first annular groove and the second annular groove are concentric.

4. A polishing apparatus for polishing a silicon wafer comprising:
- a polishing pad of claim 1;
- a driving device for driving the polishing pad disposed thereon to rotate; and
- a polishing head for fixing the silicon wafer to contact the front side of the silicon wafer with the polishing pad and suspend the edge of the silicon wafer above the first annular groove and/or the second annular groove of the polishing pad.

* * * * *